United States Patent
Yabe et al.

(10) Patent No.: US 8,175,738 B2
(45) Date of Patent: May 8, 2012

(54) DEVICE MANUFACTURING APPARATUS AND DEVICE MANUFACTURING METHOD

(75) Inventors: Toshio Yabe, Komae (JP); Satoshi Sugiura, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 12/207,903

(22) Filed: Sep. 10, 2008

(65) Prior Publication Data

US 2009/0075209 A1 Mar. 19, 2009

(30) Foreign Application Priority Data

Sep. 14, 2007 (JP) ................................ 2007-240180

(51) Int. Cl.
*G06F 19/00* (2006.01)
(52) U.S. Cl. ................... 700/112; 700/121; 700/230
(58) Field of Classification Search .................. 700/112, 700/113, 117, 121, 230; 430/311
See application file for complete search history.

(56) References Cited

U.S. PATENT DOCUMENTS

| | | | |
|---|---|---|---|
| 6,360,133 B1 * | 3/2002 | Campbell et al. ............. | 700/121 |
| 6,403,905 B1 * | 6/2002 | Conboy et al. ................ | 209/563 |
| 6,529,789 B1 * | 3/2003 | Campbell et al. ............. | 700/117 |
| 6,653,032 B2 * | 11/2003 | Miwa et al. .................... | 430/30 |
| 6,721,940 B2 * | 4/2004 | Miwa et al. .................... | 700/121 |
| 6,842,230 B2 * | 1/2005 | Takakuwa et al. ............. | 355/77 |
| 7,089,077 B1 * | 8/2006 | Reitmeyer et al. ............ | 700/121 |
| 7,162,326 B1 * | 1/2007 | Shirley et al. ................ | 700/121 |
| 7,194,328 B1 * | 3/2007 | Haskins et al. ............... | 700/174 |
| 7,206,652 B2 * | 4/2007 | Burda et al. .................. | 700/121 |
| 7,257,453 B2 * | 8/2007 | Kemmoku .................... | 700/100 |
| 7,257,459 B1 * | 8/2007 | Qu ................................. | 700/121 |
| 7,403,831 B2 * | 7/2008 | Sugiura ......................... | 700/100 |
| 8,050,793 B1 * | 11/2011 | Haskins et al. ............... | 700/174 |
| 2008/0201003 A1 * | 8/2008 | Maskara et al. .............. | 700/121 |

FOREIGN PATENT DOCUMENTS

| | | |
|---|---|---|
| JP | 08-167562 A | 6/1996 |
| JP | 2000-323391 A | 11/2000 |
| JP | 2001-307972 A | 11/2001 |

* cited by examiner

*Primary Examiner* — Charles Kasenge
(74) *Attorney, Agent, or Firm* — Canon U.S.A., Inc. IP Division (57) ABSTRACT

An apparatus for manufacturing a device comprises a processing unit configured to perform a process for manufacturing the device, a conveying unit configured to convey an article to the processing unit, and a controller configured to control the conveying unit based on a job queue. Information for controlling conveyance of an article for a job next to a job for which the processing unit is performing the process is registered in the job queue. The controller is configured to control the conveying unit so as to convey the article for the next job in advance, based on the information.

8 Claims, 6 Drawing Sheets

| 201 | 202 | 203 | 204 | 205 | 206 |
|---|---|---|---|---|---|
| JOB ID | JOB NAME | RETICLE CONVEYANCE DESTINATION | WAFER CONVEYANCE DESTINATION | PREPARATORY CONVEYANCE ENABLE/DISABLE STATE OF NEXT RETICLE | PREPARATORY CONVEYANCE ENABLE/DISABLE STATE OF NEXT WAFER |
| 1 | Lot1 | STAGE | STAGE | ENABLED | ENABLED |
| 2 | Lot2 | STAGE | STAGE | ENABLED | ENABLED |
| 3 | Command1 | NONE | STAGE | DISABLED | DISABLED |
| 4 | Lot3 | STAGE | STAGE | ENABLED | ENABLED |
| 5 | Lot4 | STAGE | STAGE | ENABLED | ENABLED |

FIG. 3

| JOB ID | JOB NAME | RETICLE CONVEYANCE DESTINATION | PREPARATORY CONVEYANCE ENABLE POSITION OF NEXT RETICLE | RETICLE CURRENT POSITION |
|---|---|---|---|---|
| 1 | Lot1 | STAGE C | 3B | 4D |
| 2 | Lot2 A | STAGE | 3 | 2 |
| 3 | Command1 | NONE | 2 | 0 |
| 4 | Lot3 | STAGE | 3 | 0 |
| 5 | Lot4 | STAGE | 3 | 0 |

301  302  303  304  206

[EXAMPLE OF RETICLE STANDBY ENABLE POSITION]
4: RETICLE STAGE
3: RETICLE PRE-STAGE
2: SECOND RETICLE RELAY STORAGE UNIT
1: FIRST RETICLE RELAY STORAGE UNIT
0: RETICLE LIBRARY

A: "PREPARATORY CONVEYANCE POSITION OF TARGET JOB"
B: "PREPARATORY CONVEYANCE ENABLE POSITION (i.e., ATTRIBUTE OF PRECEDING JOB)"
C: "CONVEYANCE DESTINATION OF PRECEDING JOB"
D: CURRENT CONVEYANCE POSITION OF PRECEDING JOB"

DEVICE MANUFACTURING APPARATUS AND DEVICE MANUFACTURING METHOD

BACKGROUND OF THE INVENTION

1. Field of the Invention

The present invention relates to a device manufacturing apparatus capable of continuously processing a plurality of lots and a device manufacturing method.

2. Description of the Related Art

An exposure process conventionally starts after an apparatus is instructed to start a lot process a wafer is loaded, it reaches a wafer stage, and the exposure process begins at the time a reticle or mask serving as a circuit master for exposing the wafer reaches the wafer stage.

Japanese Patent Laid-Open No. 8-167562 discloses the following technique. A wafer is loaded from a lot in accordance by a process start instruction by the automatic start of a lot by a job queue in which a lot process line is already designated or by a process start instruction by an operator in accordance with a job queue. When the wafer reaches the wafer stage, the exposure process starts.

Japanese Patent Laid-Open No. 2000-323391 proposes the following technique. When a job queue indicates a plurality of reticles in the succeeding lots, the reticle arrangement location is determined in accordance with the reticle use order, thereby minimizing the reticle conveyance time.

Japanese Patent Laid-Open No. 2001-307972 proposes the following technique. When continuously processing a plurality of lots, it is determined whether the next lot is processible. Before completion of processing of the lot currently being processed, the processing of the next lot proceeds in the possible range for the next lot.

In a semiconductor manufacturing apparatus, jobs continuously registered in a job queue include not only lot processing for a manufacturing process but also a tuning commands for a semiconductor exposure apparatus. Tuning commands include those which cannot be performed when materials such as a wafer and reticle are located in a conveyance path. Even for job queues which handle only lot processing, each time tuning is required an operator must stop succeeding jobs, interrupting them to perform the corresponding tuning and the like, and this makes it impossible to sufficiently enhance a preparatory conveyance function for materials for succeeding job.

SUMMARY OF THE INVENTION

It is an exemplary object of the present invention to improve the throughput of a device manufacturing apparatus which executes a job that accompanies article conveyance.

According to a first aspect of the present invention, there is provided an apparatus for manufacturing a device, the apparatus comprising:

a processing unit configured to perform a process for manufacturing the device;

a conveying unit configured to convey an article to the processing unit; and a controller configured to control the conveying unit based on a job queue, wherein information for controlling conveyance of an article for a job next to a job for which the processing unit is performing the process is registered in the job queue, and the controller is configured to control the conveying unit so as to convey the article for the next job in advance, based on the information.

According to a second aspect of the present invention, there is provided a method of manufacturing a device, the method comprising steps of:

conveying an article to a processing unit configured to perform a process for manufacturing the device, based on a job queue; and processing the conveyed article in the processing unit, wherein information for controlling conveyance of an article for a job next to a job for which the processing unit is performing the process is registered in the job queue, and in the conveying step, the article for the next job is conveyed in advance based on the information.

According to the present invention, the throughput of the device manufacturing apparatus which executes a job that accompanies article conveyance, for example, can be improved.

Further features of the present invention will become apparent from the following description of exemplary embodiments with reference to the attached drawings.

DESCRIPTION OF THE EMBODIMENTS

Figure 1:
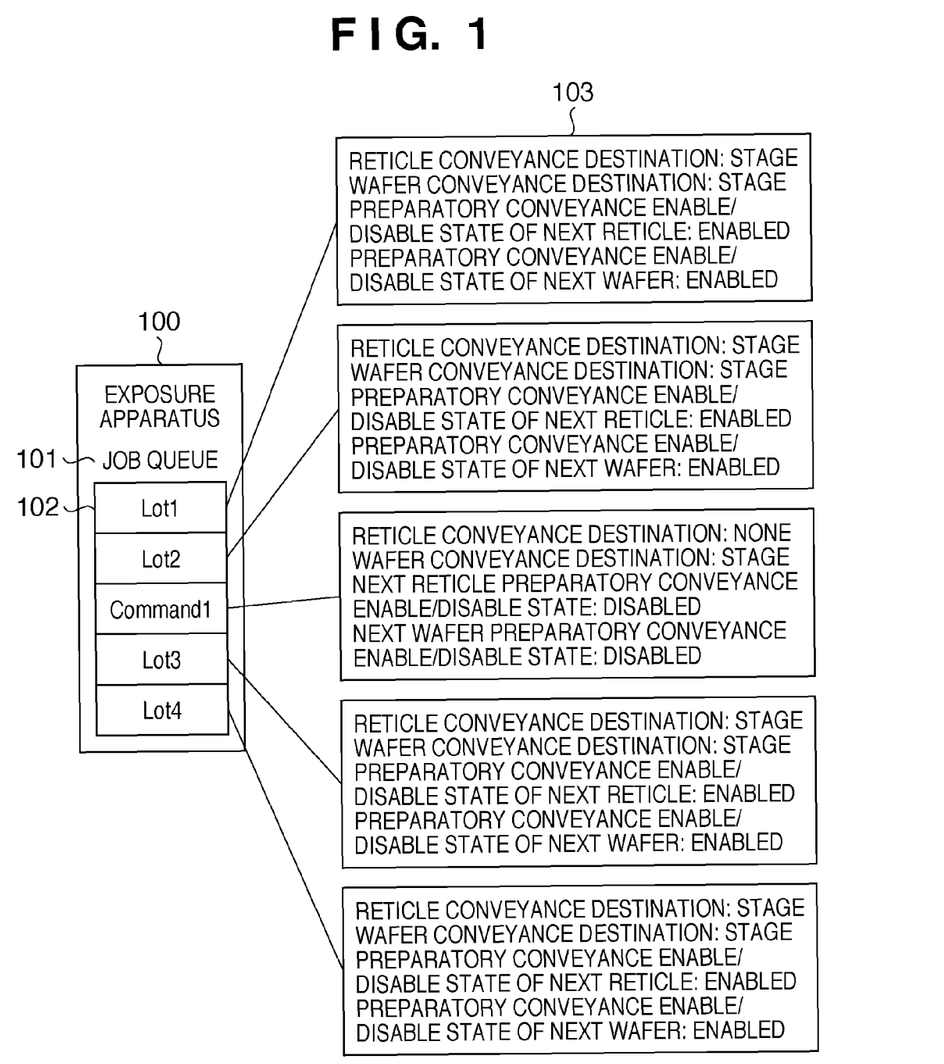
FIG. 1 is a conceptual view showing the overall arrangement of an embodiment.

Preferred embodiments of the present invention will be described in detail with reference to the accompanying drawings. FIG. 1 is a conceptual view showing the overall arrangement of an example of a semiconductor manufacturing apparatus used in a semiconductor manufacturing method according to the present invention. The semiconductor manufacturing apparatus comprises a processing unit, a conveying unit which conveys an article to be used or processed in the processing unit, a queue table, and a controller which controls the conveying unit based on the queue table. The semiconductor manufacturing apparatus of this embodiment is an exposure apparatus 100.

Figure 6:
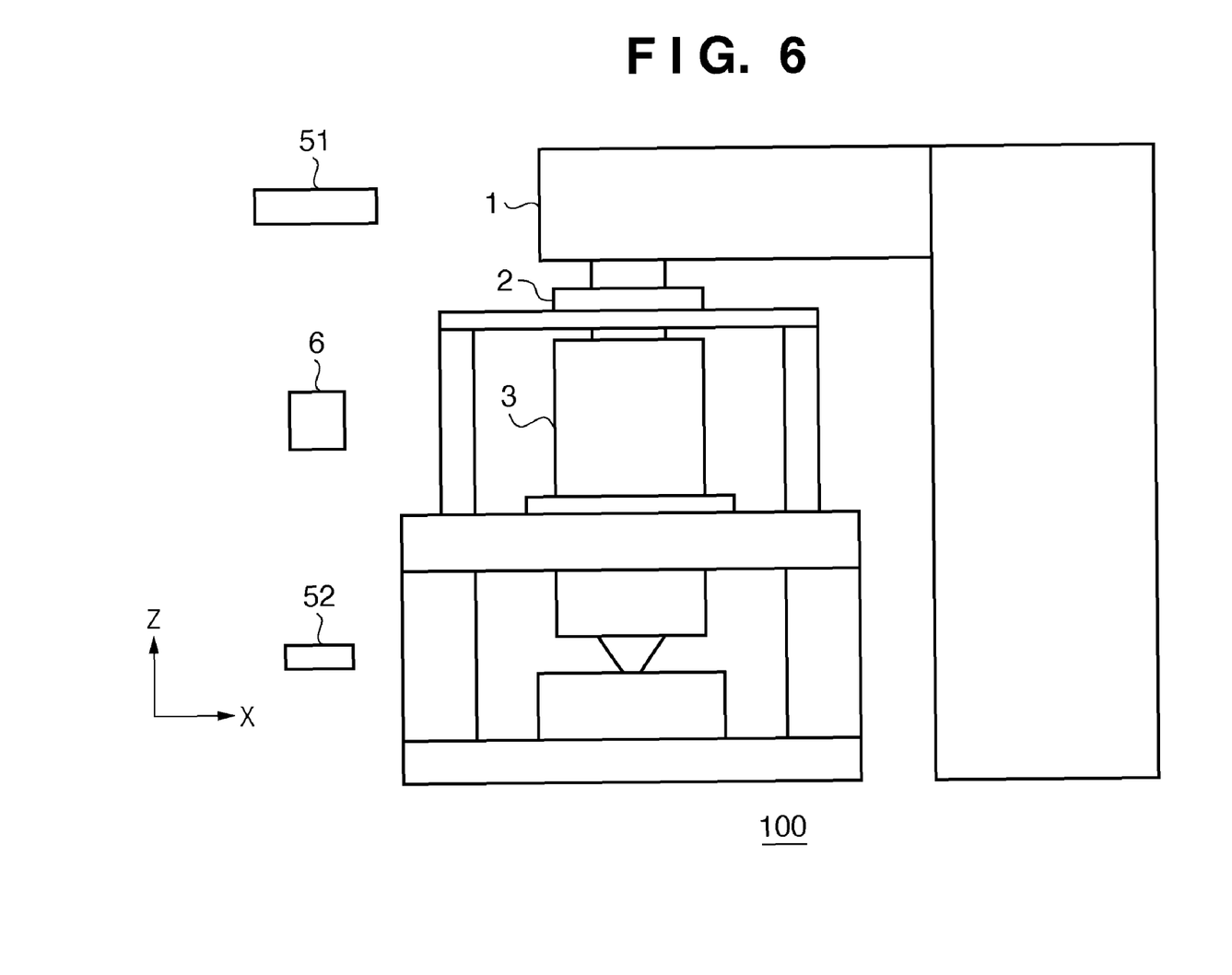
FIG. 6 is a view for explaining an exposure apparatus.

As shown in FIG. 6, the exposure apparatus 100 comprises an illumination system 1, a reticle stage 2 mounted with a reticle, a projection optical system 3, and a wafer stage 4 mounted with a wafer. The exposure apparatus 100 further comprises a reticle conveying unit 51 which conveys a reticle, a wafer conveying unit 52 which conveys a wafer, and a controller 6 which controls the reticle conveying unit 51 and the wafer conveying unit 52. The exposure apparatus 100 projects and exposes a circuit pattern formed on a reticle onto a wafer and employs a step & repeat projection exposure scheme or a step & scan projection exposure scheme.

The illumination system 1 illuminates a reticle on which a circuit pattern is formed and comprises a light source and illumination optical system. The light source unit comprises, for example, a laser as a light source. The laser can be an ArF excimer laser with a wavelength of about 193 nm, a KrF excimer laser with a wavelength of about 248 nm, or an $F_2$ excimer laser with a wavelength of about 153 nm. The type of laser is not limited to an excimer laser, but a YAG laser is usable. The number of lasers is not specifically limited to one. When the light source employs a laser, a light beam shaping optical system for shaping a parallel beam from a laser source into a desired beam shape and an incoherent optical system for converting a coherent laser beam into an incoherent laser beam are preferably used. A light source usable in the light source unit is not limited to the lasers. One or a plurality of lamps such as mercury lamps or xenon lamps are usable.

The illumination optical system is an optical system which illuminates a mask and includes a lens, mirror, light integrator, and stop.

The projection optical system 3 can be an optical system including only a plurality of lens elements, an optical system including a plurality of lens elements and at least one concave mirror, an optical system including a plurality of lens elements and a diffraction optical element, a total mirror type optical system, or the like.

The reticle stage 2 and the wafer stage 4 are movable by, for example, a linear motor. In the step & scan projection exposure scheme, these stages move in synchronism with each other. At least one of the wafer stage 4 and the reticle stage 2 includes a discrete actuator to align the reticle pattern onto the wafer.

Each job to be executed is registered in a job queue 101 serving a queue table. Reference numeral 102 denotes a start job registered in the job queue 101. "Lot" and "Command" from a second job 102 and subsequent jobs are also jobs registered in the job queue 101. "Lot" indicates the job for the manufacture, and "Command" indicates a tuning process job such as inspection. An attribute 103 held in the job 102 is control information indicating the conveyance destination of an article to be used or processed in a job or whether an article to be used or processed in the next job is conveyed in advance. Jobs other than the job 102 hold attributes similar to the job attribute 103.

The processing sequence of the flowcharts to be described later are not limited to these, but can be a combination of any sequences, a set of a plurality of jobs, or a division of a job. Each job can be used singly as one extracted functional element or used in combination with another job.

First Embodiment

Figure 2:
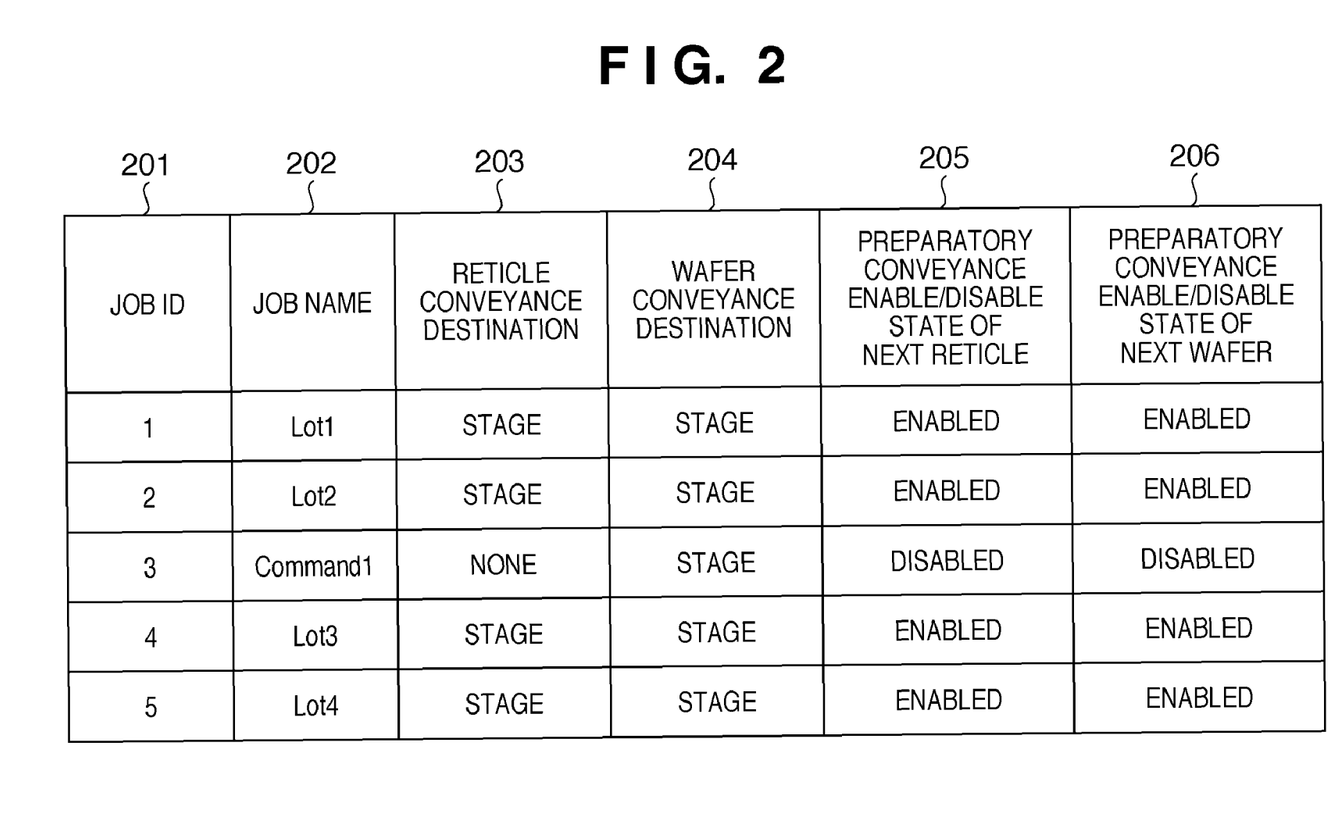
FIG. 2 is a table showing an example of job attribute information.

FIG. 2 shows a detailed example of the job attribute 103 shown in FIG. 1. A "job ID" 201 indicates a job order. A "job name" 202 indicates the name of a job. A "reticle conveyance destination" 203 indicates the final conveyance destination of the reticle to be used in the job. A "wafer conveyance destination" 204 indicates the final conveyance destination of the wafer serving as an article to be processed in the job. A "preparatory conveyance enable/disable state of next reticle" 205 is a flag indicating whether the reticle serving as an article to be used in the next job can be conveyed in advance. Assume that the final conveyance destination of the reticle of the job currently executed by the processing unit such as a stage is a reticle stage. The "preparatory conveyance" is to convey the reticle to be used in the next job to, for example, the reticle pre-stage. A "preparatory conveyance enable/disable state of next wafer" 206 is a flag indicating whether the wafer to be used in the next job is ready for conveyance as in the "preparatory conveyance enable/disable state of next reticle" 205.

Figure 4:
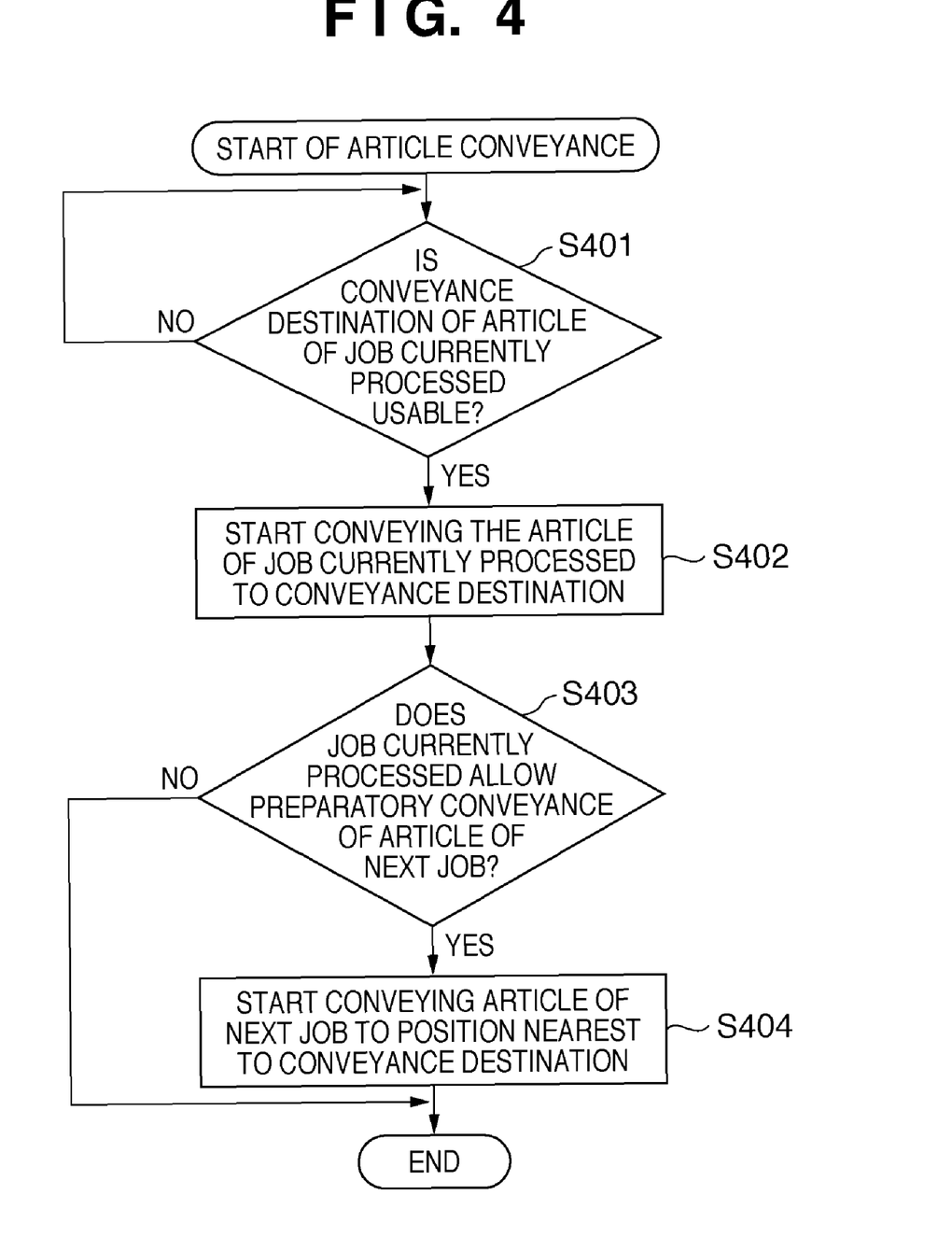
FIG. 4 is a flowchart showing an example of the preparatory conveyance process of each job material.

FIG. 4 shows the overall processing sequence of the controller which controls the conveying unit in this embodiment. The controller starts an article conveyance sequence at a timing when the start job in the job queue 101 starts. The controller starts the conveyance sequence for a job which has given up the preparatory conveyance, at a timing when the position of the article to be used or processed in each job changes. The controller can perform parallel processing by the number of articles to be simultaneously conveyed for one job. For example, when the articles, the preparatory conveyance of which is managed, are, for example, a reticle and wafer, the reticle conveyance process and the wafer conveyance process are executed at the same time.

In step S401, when starting the job process the controller confirms whether the conveyance destinations of the reticle and wafer used in the job currently processed are available and usable. If the article conveyance destinations are available and usable, the process advances to step S402. When the conveyance destinations are not available for some reason, the controller repeats steps S401 and continues to confirm until the conveyance destinations of the articles used or processed in the job currently processed are available. Assume that a job whose job ID 201 and job name 202 in FIG. 2 are "1" and "Lot1", respectively, is a job currently processed. In this case, the controller confirms whether the reticle stage is currently available and usable because the reticle conveyance destination 203 is the "stage". If the reticle is not available, the controller waits until the reticle stage becomes available.

In step S402, the controller causes the conveying unit to start conveying the article of the job currently processed to the conveyance destination. Note that this process allows execution of the process of the next step after the start of conveyance is executed but before the article reaches the conveyance destination. Assume that the job name 202 of "Lot1" in FIG. 2 is the job currently processed. In this case, the controller allows conveyance of the reticle to the reticle conveyance destination 203 of the "stage" and at the same time can advance to the process in step S403.

In step S403, the controller refers to the preparatory conveyance enable/disable information regarding a job next to the job currently processed. The controller confirms whether the job currently processed allows conveyance of the article to be used or processed in the next job. If the preparatory conveyance enable/disable information of the next job indicates an "enabled" state, the process advances to step S404. If the preparatory conveyance enable/disable information indicates a "disabled" state, the process ends, and no preparatory conveyance of the next job is performed. Assume that the job name 202 of "Lot1" in FIG. 2 is the job currently processed. Since the "reticle preparatory conveyance enable/disable state" 205 indicates an "enabled" state, the controller allows the preparatory conveyance of the next job having the job ID 201 of "2" and the job name 202 of "Lot2". The process can advance to step S404. In contrast, assume that the job currently processed has the job ID 201 of "3" and the job name 202 of "Command1". In this case, the reticle preparatory conveyance enable/disable state 205 is a "disabled" state. The preparatory conveyance of the next job having the job ID 201 of "4" and the job name 202 of "Lot3" is not allowed, and the process ends.

In step S404, the controller performs preparatory conveyance of the article to be used or processed in the next job to a position closest to the conveyance destination so as to not interfere with the process of the job currently processed. Assume that the reticle to be used in the job currently processed is processed on the reticle stage, and the reticle pre-stage is set as a position at which the reticle stands by in the conveyance path up to the reticle stage. In this case, the reticle to be used in the succeeding job is conveyed to the reticle pre-stage.

According to this embodiment, the job currently processed can have attributes such that preparatory conveyance of the article to be used or processed in the next job is performed or not during the process of the job currently processed, in accordance with the contents of the process of the job currently processed. In response to the tuning command which causes the job currently processed to inhibit preparatory conveyance of the next job, job preparatory conveyance can be automatically processed without the operator manually stopping the job or without reserving the job stop operation. As a result, the operator can generate an interrupt for a job such as a tuning command regardless of the order of the job queue.

Second Embodiment

Figure 3:
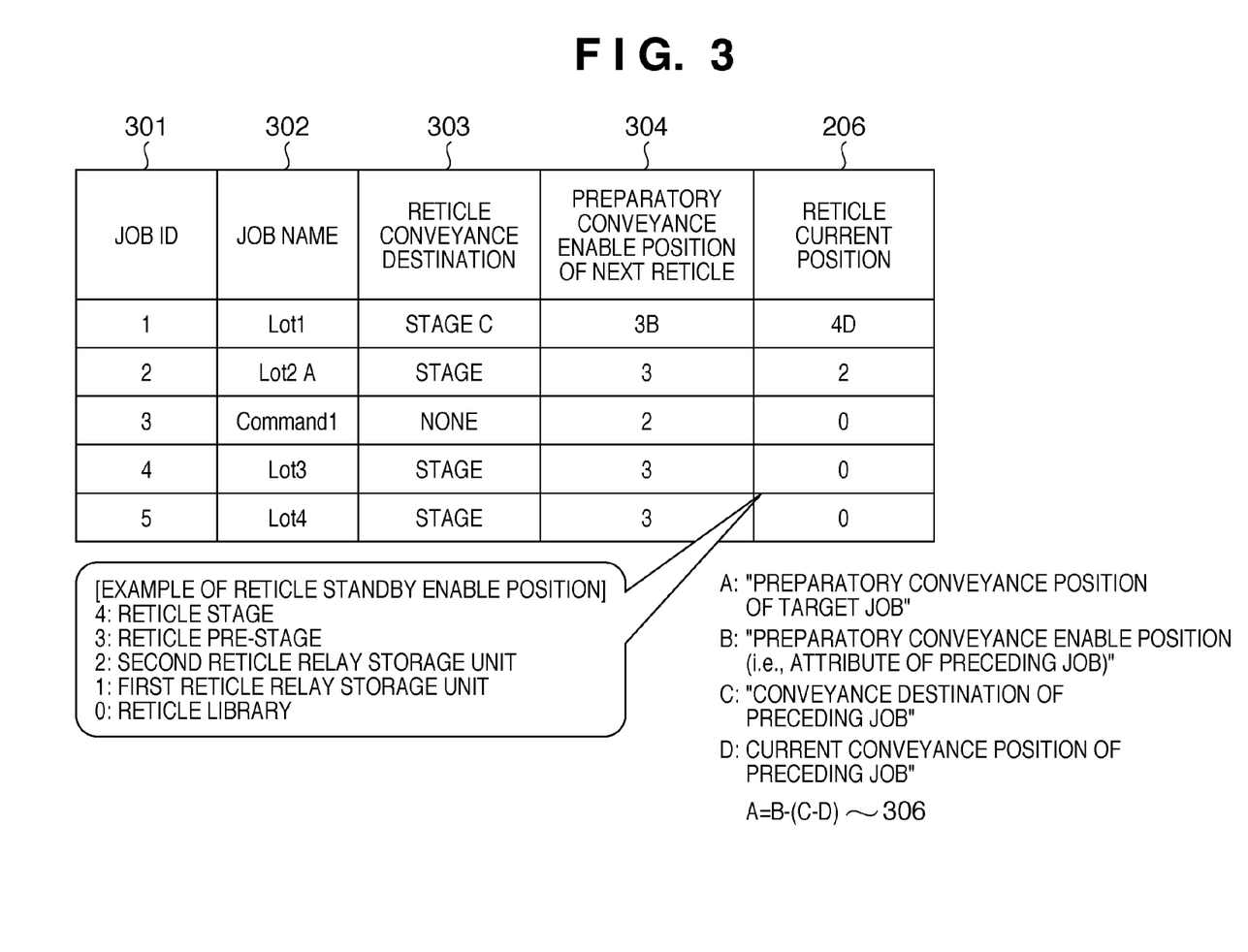
FIG. 3 is a table showing another example of job attribute information.

FIG. 3 shows an example of the information form different from that shown in FIG. 2 for a job attribute 103 shown in FIG. 1. In this example, only a reticle is taken as an example, but the same information can be held as the job attribute even in materials such as a wafer as in FIG. 2.

A job ID 301 indicates a job order. A job name 302 indicates a job name. A reticle conveyance destination 303 indicates a final conveyance destination of a reticle serving as an article to be used in a job. A next reticle preparatory conveyance enable position 304 indicates position information indicating a position where a reticle serving as an article to be processed in the next job can be conveyed in advance. Assume that the final conveyance destination of the reticle in the job currently processed is a reticle stage. In this case, the position indicates a conveyance path such as the reticle pre-stage where the reticle of the next job stands by before the reticle stage, first and second reticle relay storage units, and a reticle library.

A reticle current position 305 indicates information regarding the current position of an article to be used or processed in each job in a job queue 101. For example, the position 305 indicates information regarding a position where an article to be used in each job exists. For example, the position 305 indicates that the reticle of the job currently processed is located on the reticle stage, and the reticle of the next job is located on the reticle pre-stage.

A formula 306 in FIG. 3 is an example of a formula for calculating a position to which an article undergoes preparatory conveyance for each job in the job queue.

Figure 5:
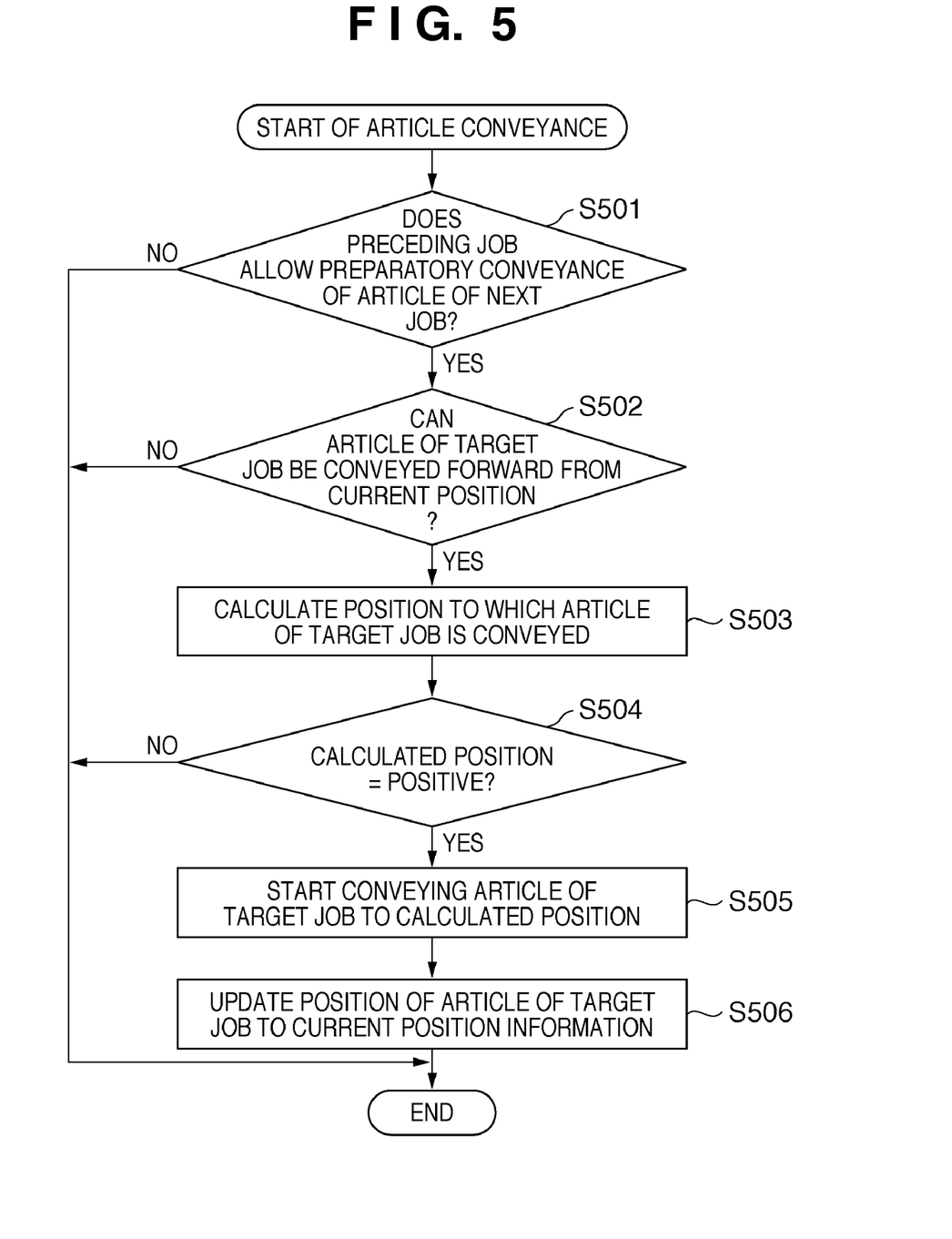
FIG. 5 is a flowchart showing another example of the preparatory conveyance process of each job material.

FIG. 5 shows the overall processing sequence of a controller of the second embodiment. The controller starts at a timing when each job in the job queue 101 can undergo preparatory conveyance. The controller also starts the sequence for a job which has given up the preparatory conveyance, periodically or at a timing when the position of an article to be used or processed in each job changes. The controller can perform parallel processing by the number of articles to be simultaneously conveyed for one job. For example, the articles, the preparatory conveyance of which is managed, are, for example, a reticle and wafer, the reticle conveyance process and the wafer conveyance process are executed at the same time.

A job serving as a target object in this flowchart is called a "target job", and a job preceding the target job is called a "preceding job".

In step S501, the controller confirms, by referring to the next job preparatory conveyance enable position information regarding the preceding job, whether the preceding job as the immediately preceding job of the target job allows preparatory conveyance of an article to be used or processed in the next job. If the next job preparatory conveyance enable position information indicates that preparatory conveyance is "enabled", for example, a value of "1 or more", the process advances to step S502. If the preparatory conveyance is "disabled", that is, a value of "0", the controller ends the process of this flowchart. Assume that the job ID 301 and the job name 302 in FIG. 3 are "2" and "Lot2", respectively. In this case, the next reticle preparatory conveyance enable position 304 of the preceding job, that is, "Lot1" has a value of 0 or more as "3: reticle pre-stage". The preparatory conveyance of the target job as "Lot2" is enabled, and the process advances to step S502. If the next reticle preparatory conveyance enable position 304 of the preceding job as "Lot1" is "0: reticle library", the preparatory conveyance of the target job is disabled.

In step S502, the controller confirms, by referring to the current position information regarding an article used or processed in the target job and the current position information regarding an article used or processed in the preceding job, whether the article can be conveyed forward from the current position of the article to be used or processed in the target job. When space for causing the article to stand by is available in the conveyance path of the articles of the target job and the preceding job, the controller advances to step S503; otherwise, the controller ends this flowchart. In FIG. 3, the reticle current position 305 of the target job as "Lot2" is "2: reticle relay storage unit 2", and the reticle current position of the preceding job as "Lot1" is "4: reticle stage". That is, "3: reticle pre-stage" is present in the conveyance path between the target job and the preceding job, and there is available space for causing the reticle of the target job to stands. The controller advances to step S503. Assume that the reticle current position of the preceding job is "3: reticle pre-stage", and the reticle conveyance position of the target job is already "2: reticle relay storage unit 2". In this case, there is no space available for conveying the reticle of the target job first. No further preparatory conveyance is available.

In step S503, the controller calculates a position where an article to be used or processed in the target job can be conveyed in advance. This calculated is made based on the information 304 indicating a position where an article to be used or processed in the a job next to the preceding job can be conveyed in advance, information 303 of the conveyance destination of the article used or processed in the preceding job, and information 305 indicating the current position of the article used or processed in the preceding job. For example, a preparatory conveyance position A of the reticle used in "Lot2" of FIG. 3 can be calculated by subtracting, from "B: reticle pre-stage 3", a difference obtained by subtracting "D: stage 4" from "C: stage 4". As a result, the preparatory conveyance position of the reticle used in the target job as "Lot2" is "A: reticle pre-stage 3". Note that the calculating method is not limited to an example of the calculation formula made in consideration of minimum conditions, but can be a formula derived from conditions such as each article and the conveyance path and characteristics such as performance, for example, the exposure speed and conveyance speed.

In step S504, the controller determines whether the value calculated in the process in step S503 is positive, that is whether the preparatory conveyance of the article to be used or processed in the target job is possible. If the preparatory conveyance is possible, the controller advances to step S505. If the value is 0 or less, that is if preparatory conveyance is not possible, the process in this flowchart ends. For example, for the target job as "Lot2" in FIG. 3, the preparatory conveyance position calculated in the process of step S503 is "3: reticle pre-stage". In this case, the process advances to step S505.

In step S505, the controller conveys the article to be used or processed in the target job to the position calculated in step S503. For example, if "Lot2" in FIG. 3 is the target job, the calculated value is "3: reticle pre-stage". The reticle used in Lot2 is conveyed from the current position, that is, the second reticle relay storage unit 2 to the reticle pre-stage 3.

In step S506, the controller updates the current position information of the article to be used or processed in the target job to the position to which the article has been conveyed in step S505. For example, if "Lot2" in FIG. 3 is the target job, "second reticle relay storage unit 2" as the reticle current position is updated to "reticle pre-stage 3" to which the reticle has been conveyed in step S505.

According to this embodiment, the article to be used or processed in the succeeding job can undergo preparatory conveyance to the designated position during the process of the job currently processed, in accordance with the contents of the process. Even for a tuning command which basically does not allow the preparatory conveyance of the succeeding job, the preparatory conveyance positions are divided, and the article can undergo preparatory conveyance to an allowed position. Preparatory conveyance for the entire job queue such as the succeeding job and succeeding standby jobs can be performed. In addition, even when jobs with small numbers of wafers in the respective lots consecutively stand by, a situation where the wafer and reticle in the succeeding job do not reach the positions near the stages regardless of the end of the process of the job currently processed can be reduced. A decrease in the total throughput can be prevented.

An exemplary device manufacturing method using the above exposure apparatus 100 will be described below.

Devices (semiconductor integrated circuits element or liquid crystal display elements) can be manufactured through an exposure step of exposing the substrate to the radiant energy using the exposure apparatus 100 of the above embodiment, a developing step of developing the substrate exposed in the exposure step, and other known steps (etching, resist removal, dicing, bonding, and packaging steps) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-240180, filed Sep. 14, 2007 which is hereby incorporated by reference herein in its entirety.

What is claimed is:

1. An apparatus for manufacturing a device, the apparatus comprising:
    a processing unit configured to perform a process for manufacturing the device;
    a conveying unit configured to convey an article to the processing unit; and
    a controller configured to control the conveying unit based on a job queue,
    wherein each job registered in the job queue includes attribute information concerning whether an article is enabled for a next job that is conveyed to a preparatory position in the apparatus in advance,
    the attribute information for a certain job includes information that indicates a conveyance destination of the article for the certain job, the preparatory position of the article for the next job, and a current position of the article for the certain job, and
    the controller is configured to calculate a conveyance destination of the article for the next job, based on the attribute information, and to cause the conveying unit to convey in advance the article for the next job to the calculated conveyance destination.

2. An apparatus according to claim 1, wherein the attribute information includes information that indicates whether it is enabled that the article for the next job is conveyed to the preparatory position in advance.

3. An apparatus according to claim 1, wherein jobs registered in the job queue includes a job for processing a lot and a job for tuning the apparatus.

4. An apparatus according to claim 1, wherein the article includes a reticle, and the apparatus is configured to expose a substrate to radiant energy via the reticle.

5. An apparatus according to claim 1, wherein the article includes a substrate, and the apparatus is configured to expose the substrate to radiant energy.

6. A method of manufacturing a device, the method comprising:
    exposing a substrate to radiant energy using an exposure apparatus;
    developing the exposed substrate; and
    processing the developed substrate to manufacture the device,
    wherein the apparatus comprises:
    an exposure unit configured to expose a substrate to radiant energy via a reticle;
    a conveying unit configured to convey a reticle to the exposure unit; and
    a controller configured to control the conveying unit based on a job queue,
    wherein each job registered in the job queue includes attribute information concerning whether a reticle is enabled for a next job that is conveyed to a preparatory position in the apparatus in advance,
    the attribute information for a certain job includes information that indicates a conveyance destination of the article for the certain job, the preparatory position of the article for the next job, and a current position of the article for the certain job, and
    the controller is configured to calculate a conveyance destination of the article for the next job, based on the attribute information, and to cause the conveying unit to convey in advance the reticle for the next job to the calculated conveyance destination.

7. A method of manufacturing a device, the method comprising:
    exposing a substrate to radiant energy using an exposure apparatus;
    developing the exposed substrate; and
    processing the developed substrate to manufacture the device,
    wherein the apparatus comprises:
    an exposure unit configured to expose a substrate to radiant energy;
    a conveying unit configured to convey a substrate to the exposure unit; and
    a controller configured to control the conveying unit based on a job queue,
    wherein each job registered in the job queue includes attribute information concerning whether a substrate is enabled for a next job that is conveyed to a preparatory position in the apparatus in advance,
    the attribute information for a certain job includes information that indicates a conveyance destination of the article for the certain job, the preparatory position of the article for the next job, and a current position of the article for the certain job, and
    the controller is configured to calculate a conveyance destination of the article for the next job, based on the attribute information, and to cause the conveying unit to convey in advance the substrate for the next job to the calculated conveyance destination.

8. A method of manufacturing a device, the method comprising steps of:

conveying an article to a processing unit configured to perform a process for manufacturing the device, based on a job queue; and performing the process using the conveyed article in the processing unit, wherein each job registered in the job queue includes attribute information concerning whether an article is enabled for a next job that is conveyed to a preparatory position in advance, the attribute information for a certain job includes information that indicates a conveyance destination of the article for the certain job, the preparatory position of the article for the next job, and a current position of the article for the certain job, and a conveyance destination of the article for the next job is calculated based on the attribute information, and the article for the next job is conveyed in advance based on the attribute information in the conveying step to the calculated conveyance destination.

* * * * *